United States Patent
Tudhope et al.

(10) Patent No.: US 9,466,772 B2
(45) Date of Patent: Oct. 11, 2016

(54) METHOD AND APPARATUS FOR PROVIDING HIGH-TEMPERATURE MULTI-LAYER OPTICS

(71) Applicants: Robert Tudhope, Kalispell, MT (US); Xiaolu Chen, Dublin, CA (US); Wenhui Zhang, Pleasanton, CA (US)

(72) Inventors: Robert Tudhope, Kalispell, MT (US); Xiaolu Chen, Dublin, CA (US); Wenhui Zhang, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 14/633,801

(22) Filed: Feb. 27, 2015

(65) Prior Publication Data

US 2015/0249071 A1    Sep. 3, 2015

Related U.S. Application Data

(60) Provisional application No. 61/947,144, filed on Mar. 3, 2014.

(51) Int. Cl.
| | |
|---|---|
| *H01L 33/00* | (2010.01) |
| *H01L 33/56* | (2010.01) |
| *H01L 33/48* | (2010.01) |
| *H01L 33/64* | (2010.01) |
| *H01L 33/58* | (2010.01) |
| *H01L 33/54* | (2010.01) |

(52) U.S. Cl.
CPC .............. *H01L 33/56* (2013.01); *H01L 33/48* (2013.01); *H01L 33/58* (2013.01); *H01L 33/64* (2013.01); *H01L 33/54* (2013.01); *H01L 2933/005* (2013.01)

(58) Field of Classification Search
None
See application file for complete search history.

(56) References Cited

U.S. PATENT DOCUMENTS

| | | | | |
|---|---|---|---|---|
| 8,765,500 | B2* | 7/2014 | Tseng | H01L 33/62 257/13 |
| 2001/0000622 | A1* | 5/2001 | Reeh | C09K 11/7718 257/98 |
| 2012/0104435 | A1* | 5/2012 | Lee | H01L 33/54 257/98 |
| 2013/0126922 | A1* | 5/2013 | Lai | H01L 33/507 257/98 |
| 2013/0292636 | A1* | 11/2013 | Schubert | H01L 25/0753 257/13 |

* cited by examiner

*Primary Examiner* — Minh-Loan Tran
(74) *Attorney, Agent, or Firm* — JW Law Group; James M Wu

(57) ABSTRACT

A solid-state light-emitting device ("SLD") converting electrical energy to photon energy using a light emitter diode ("LED") and high-temperature multi-layer optics ("HMO") is disclosed. The SLD, in one aspect, includes a chip-on-board ("COB"), a silicone inner layer ("SIL"), and a Poly methyl methacrylate ("PMMA") layer. The COB includes a first surface and a second surface wherein the first surface includes at least one LED. The LED converts electrical energy to optical light and the light subsequently leaves the LED becoming visible light. The SIL includes a first silicone surface and a second silicone surface wherein the second silicone surface is in contact with the first surface of COB and the second silicone surface is in contact with the PMMA layer. The operating temperature of PMMA layer is lower than the operating temperature of SIL.

20 Claims, 9 Drawing Sheets

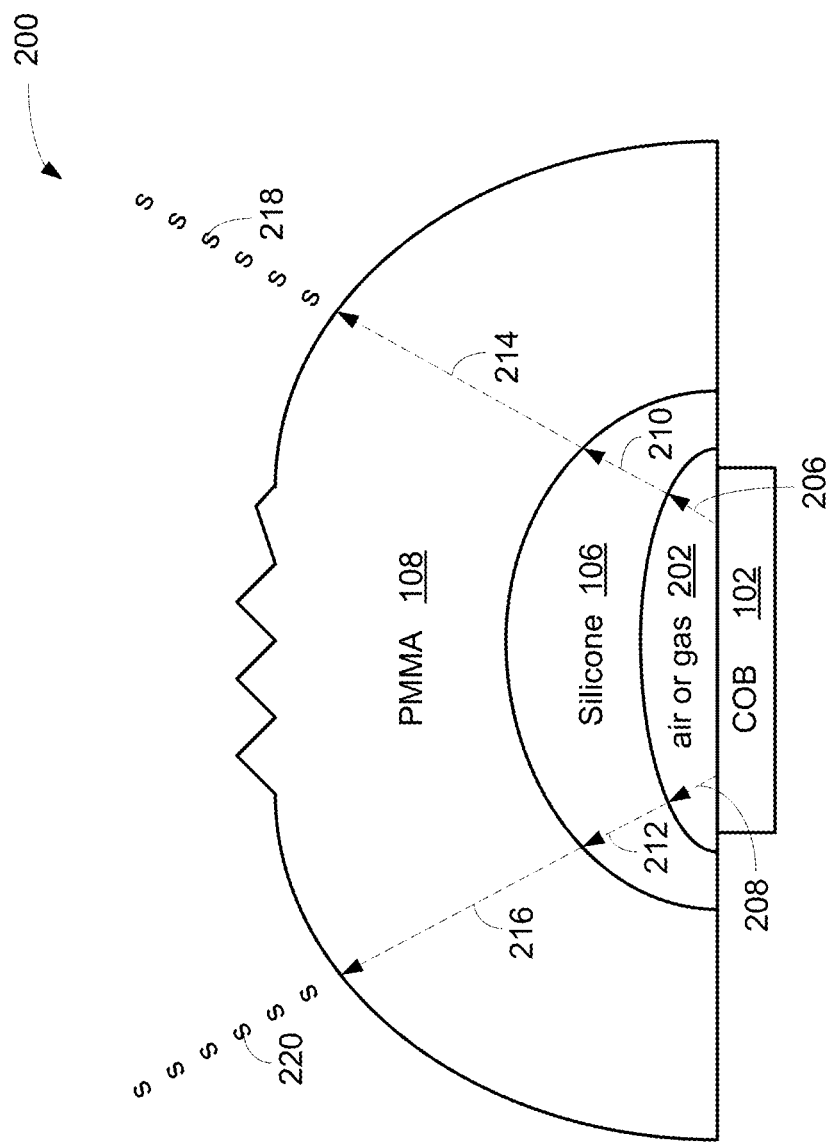

METHOD AND APPARATUS FOR PROVIDING HIGH-TEMPERATURE MULTI-LAYER OPTICS

PRIORITY

This application claims the benefit of priority based upon U.S. Provisional Patent Application Ser. No. 61/947,144, filed on Mar. 3, 2014 in the name of the same inventor(s) and having a title of "Method and Apparatus for Providing High-temperature Multi-layer Optics," hereby incorporated into the present application by reference.

FIELD

The exemplary aspect(s) of the present invention relates to solid-state lighting devices. More specifically, the aspect(s) of the present invention relates to optics used in light-emitting diode ("LED") devices.

BACKGROUND

With continuing improvement in semiconductor based solid-state light emitting devices, Edison's incandescent light bulbs, which typically have less than 30% of light efficiency, will soon be replaced with energy-efficient semiconductor based solid-state light emitting devices such as light-emitting diodes ("LEDs"). A conventional LED, for example, is small, energy efficiency, and long lifespan. Various commercial applications relating to solid-state lightings, such as homes, buildings, street lightings, traffic lights, and electronic billboards, have already placed in service.

An LED device typically contains a biased p-n junction which is capable of emitting narrow-spectrum light or electroluminescence. Amount of emitted light and/or color of light usually depends on the composition of optical material(s) used in the LED device. The efficiency of LED device as well as color variations associated with the visible light are partially dependent on the type of optical material(s) or optics used.

A conventional optical material or optics is ploy methyl methacrylate ("PMMA") which is commonly used in the LED field. Although PMMA provides efficient light passage as well as versatile moldability, a drawback associated with conventional PMMA material is that it possesses a relatively low operating and/or melting temperature. With increasing power and optical flux generated by new LEDs or LED arrays, the conventional PMMA material becomes less desirable optical material for high-powered LED devices partially because of its relatively low operating temperature and/or heat tolerance.

SUMMARY

Aspect(s) of the present invention discloses a solid-state lighting device ("SLD") using light emitter diode ("LED") with high-temperature multi-layer optics ("HMO") to generate light. The SLD includes a chip-on-board ("COB"), a silicone inner layer ("SIL"), and a poly methyl methacrylate ("PMMA") layer. The COB includes a first surface and a second surface wherein the first surface is a light emitting surface that includes at least one LED. The LED or LED array converts electrical energy to optical light which leaves the LED via the first surface or light emitting surface. The SIL includes a first silicone surface and a second silicone surface wherein the second silicone surface is in contact with the first surface of COB and the second silicone surface is in contact with the PMMA layer. The PMMA layer has a PMMA operating temperature which is lower than the operating temperature of SIL. The PMMA has an inner surface and an outer surface wherein the inner surface is in touch with the first silicone surface of SIL.

It is understood that other aspects of the present invention will become readily apparent to those skilled in the art from the following detailed description, wherein it is shown and described only exemplary configurations of an LED by way of illustration. As will be realized, the present invention includes other and different aspects and its several details are able to be modified in various other respects, all without departing from the spirit and scope of the present invention. Accordingly, the drawings and the detailed description are to be regarded as illustrative in nature.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

FIG. 2 is a block diagram illustrating an SLD containing a COB and a multilayered optics having a gap in accordance with one aspect of the present invention;

DETAILED DESCRIPTION

Figure 1:
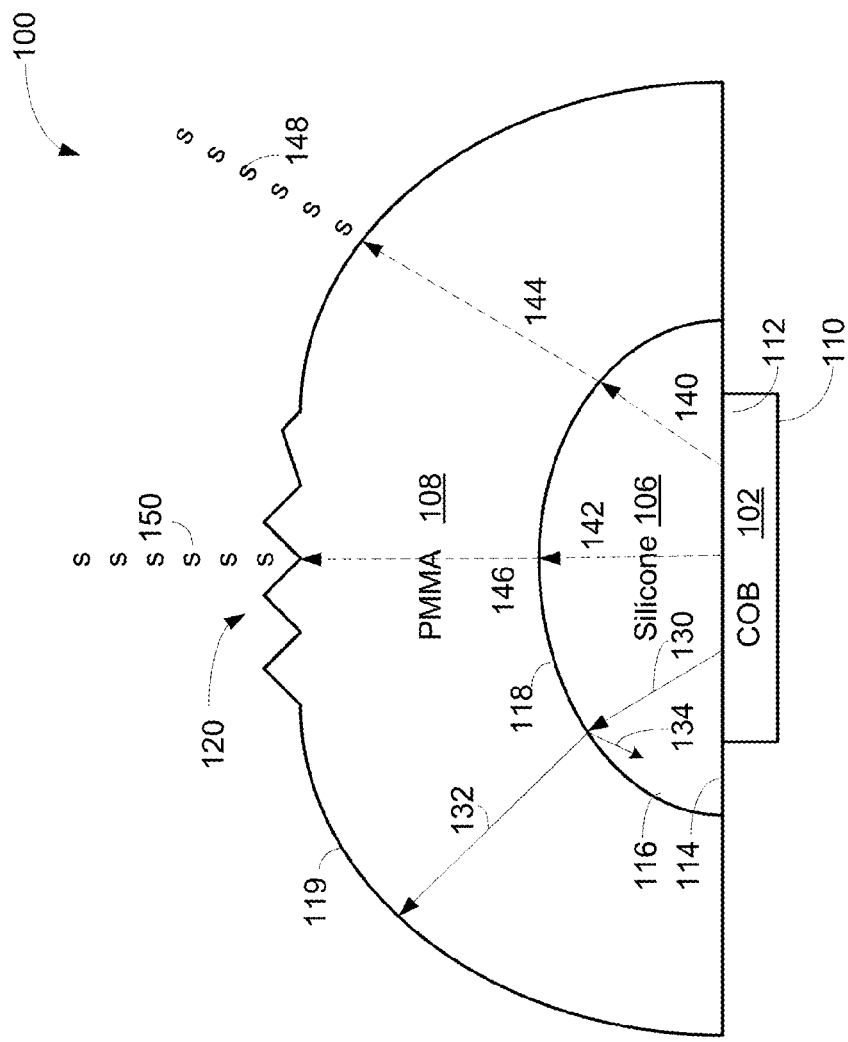
FIG. 1 is a block diagram illustrating a solid-state lighting device ("SLD") containing an LED and a high-temperature multi-layer optics ("HMO") to generate light in accordance with one aspect of the present invention.

Aspects of the present invention are described herein in the context of a method, device, and apparatus capable of generating optical light using light-emitting diodes ("LEDs") molded with multilayered optical materials.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure is thorough and complete, and fully conveys the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skills in the art to which this invention belongs. It will be further understood that terms, such as those defined in commonly used dictionaries, should be interpreted as having a meaning that is consistent with their meaning in the context of the relevant art and this disclosure.

Various aspects of an LED luminaire will be presented. However, as those skilled in the art will readily understand, these aspects of invention may be extended to aspects of LED luminaries without departing from the invention. The LED luminaire may be configured as a direct replacement for conventional luminaries, including, by way of example, recessed lights, surface-mounted lights, pendant lights, sconces, cove lights, track lighting, under-cabinet lights, landscape or outdoor lights, flood lights, search lights, street lights, strobe lights, bay lights, strip lights, industrial lights, emergency lights, balanced arm lamps, accent lights, background lights, and other light fixtures.

As used herein, the term "light fixture" shell mean the outer shell or housing of a luminaire. The term "luminaire" shell mean a light fixture complete with a light source and other components (e.g., a fan for cooling the light source, a reflector for directing the light, etc.), if required. The term "LED luminaire" shall mean a luminaire with a light source comprising one or more LEDs. LEDs are well known in the art, and therefore, will only briefly be discussed to provide a complete description of the invention.

Aspect(s) of the present invention discloses a solid-state light-emitting device ("SLD") using LED and high-temperature multi-layer optics ("HMO"). The SLD includes a chip-on-board ("COB"), a silicone inner layer ("SIL"), and a poly methyl methacrylate ("PMMA") layer. The COB includes a first surface and a second surface wherein the first surface is a light emitting surface that includes at least one LED. The LED or LED array converts electrical energy to optical light wherein the light leaves the LED via the first surface or light emitting surface. The SIL includes a first silicone surface and a second silicone surface wherein the second silicone surface is in contact with the first surface of COB. The second silicone surface of SIL is in contact with the PMMA layer. Note that the operating temperature of the PMMA layer is lower than the operating temperature of SIL. The PMMA has an inner surface and an outer surface wherein the inner surface is in touch or contact with the first silicone surface of SIL.

FIG. 1 is a block diagram 100 illustrating an SLD containing an LED and a high-temperature multi-layer optics ("HMO") or multilayered optics for generating light in accordance with one aspect of the present invention. Diagram 100 includes COB 102, silicone layer 106, and PMMA layer 108, wherein silicone layer 106 and PMMA layer 108, in one aspect, forms the HMO. COB 102 includes a light emitting surface 112 and a connecting surface 110 wherein light emitting surface 112 includes one or more LEDs or LED arrays which are used to generate optical light, photon, and/or electroluminescence. Connecting surface 110 of COB 102 is used to couple to a substrate, not shown in FIG. 1, for electrical connections or contacts. It should be noted that the underlying concept of the exemplary aspect(s) of the present invention would not change if one or more elements (or layers) were added to or removed from diagram 100.

COB 102 is an LED chip or LED chips (or dies) mounted on a board. COB 102 is also known as an LED packaging technology using solid-state light source such as an LED array attached to a circuit board. COB 102 essentially packs one or multiple LED chips into a lighting module or lighting package. One advantage of using COB over traditional lighting source is that it conserves energy consumption and prolongs lifespan of SLD. COB 102 includes a light emitting surface 112 and a connecting surface 110, wherein light emitting surface 112 includes an LED chip or an LED array, not shown in FIG. 1.

Light emitting surface 112 of COB 102 is configured to couple to inner silicon surface 114 of silicone layer 106. In one aspect, light emitting surface 112 is in direct contact with inner silicon surface 114 of silicone layer 106. Alternatively, light emitting surface 112 is disposed over inner silicon surface 114 of silicone layer 106 in which additional layer(s) such as an air gap may be situated between light emitting surface 112 of COB 102 and inner silicon surface 114 of silicone layer 106. Connecting surface 110 of COB 102, in one example, is used to couple to a substrate for physical support as well as electrical connections. Note that the electrical connections may include wire bonding, soldering, and the like.

During the operation, COB 102 converts electrical energy into optical light such as light 130 which is generated by the LED. Light 130 exits COB 102 through light emitting surface 112. While emitting light such as light 130, COB 102 also generates heat such as radiant heat 140 as a byproduct of light generation. More heat will be generated if more light is produced. Depending on the ambient temperature, intensity of photon energy, and amount of light flux, light emitting surface 112 can reach a temperature range between 85 Celsius ("° C.") and 130° C. It should be noted that COB 102 can also be referred to as LED chip (die) mounted on a printed circuit board ("PCB").

Silicone layer 106 includes polymers that may contain a combination of silicon, carbon, hydrogen, and/or oxygen elements. The properties of silicone allow light passage with minimal loss. In addition, silicone also provides low thermal conductivity, stability, and relatively high melting temperature. For example, silicone layer 106 can operate normally at a temperature range between 100° C. and 300° C. It should be noted that silicone layer 106 can also be referred to as polymerized siloxanes or polysiloxanes.

Silicone layer 106 includes a light receiving surface 114 and light exiting surface 116 wherein the light receiving surface 114, in one example, is directly in contact with emitting surface 112 of COB 102. When COB 102 generates light such as radiant light 130, the light, for example, enters from light receiving surface 114 of silicone 106 and at least a portion of light such as radiant light 132 exits from light exiting surface 116 of silicone 106. Depending on the reflective index of silicone layer 106, a portion of light such as radiant light 134 of radiant light 130 may be deflected at light exiting surface 116 of silicone 106 while a portion of light such as radiant light 132 passes through silicone layer 106. It should be noted that silicone layer 106 may be substituted with other types of chemical compound as long as the chemical compound possesses similar physical properties as silicone layer 106.

In one aspect, silicone layer 106 can also be configured to assist in extracting light from one or more LEDs if the total index of silicone layer 106 is similar to the primary optics of LED(s). Depending on the applications, additional layer or layers with different physical properties may be inserted between silicone layer 106 and COB 102.

PMMA layer 108 is a transparent lightweight plastic with relatively low operating temperature. The melting temperature for PMMA layer 108 is generally in a range of 85° C. to 130° C. An advantage of using PMMA as optics is that it is able to facilitate light passage with minimal loss of photon. Another advantage of using PMMA is that it is easy to mold and/or relatively stable once the PMMA is cured.

PMMA layer 108, in one aspect, includes an inner surface 118 and an outer surface 119 wherein the inner surface 118 is directly in contact with light exiting surface 116 of silicone layer 106. When COB 102 generates radiant light 130, it, for example, enters silicone layer 106 from light receiving surface 114 of silicone 106 and continues traveling through PMMA layer 108 after crossing the boundary between silicone layer 106 and PMMA layer 108. Depending on the reflective index of silicone layer 106 and PMMA layer 108, a portion of light such as radiant light 134 from light 130 may be deflected at light exiting surface 116 of silicone 106 while a portion of light such as radiant light 132 leaves silicone layer 106 entering PMMA layer 108. It should be noted that silicone layer 106 may be substituted with other types of compound materials as long as the compound possesses similar physical properties as PMMA layer 108.

Referring back to FIG. 1, the SLD device includes COB 102, SIL 106, and PMMA layer 108 for generating light. COB 102 includes a first surface 110 and a second surface 112 wherein first surface 110 contains at least one LED. COB 102 is capable of emitting optical light via the LED which may be organized as an LED array and guides the optical light passing through the HMO. SIL 106 includes a first silicone surface 116 and a second silicone surface 114 wherein second silicone surface 114 is disposed on first surface 112 of COB 102. SIL 106 has a higher melting temperature than that of PMMA layer 108. It should be noted that additional optical layer(s) may be inserted between first surface 112 of COB 102 and second silicone surface 114 of silicone layer 106.

PMMA layer 108 includes inner surface 118 and an outer surface 119 wherein inner surface 118 is disposed on first silicone surface 116 of SIL 106. In one aspect, disposing PMMA layer 108 over SIL 106 forms a multilayered optic or HMO or optical lens. The SLD, in one aspect, includes a substrate and a heat sink. The substrate has a first substrate surface and a second substrate surface. Second surface 110 of COB 102 attaches to the first substrate surface of the substrate. The heat sink is mounted at the second substrate surface of the substrate for heat dissipation. It should be noted that the substrate further includes heat dissipation channels or heat pipes configured to transfer heat between COB 102 and the heat sink for thermal management.

To maintain high luminous flux, the SLD employs HMO which contains different thermal regions to create a temperature gradient across the HMO for heat dissipation and/or thermal management. For example, radiant heat 140-142 generated by COB 102 travels from silicone layer 106 to PMMA layer 108 and eventually exits PMMA layer 108 as indicated by numerals 148-150. In one example, the temperature of radiant heat 140 is higher than the temperature of radiant heat 144. Similarly, the overall temperature in silicone layer 106 is higher than the overall temperature of PMMA layer 108 because silicone layer 106 is physically closer to COB 102. Alternative, heat can also be dissipated through a heat sink coupled to COB 102 via a substrate.

When silicone layer 106 is in contact with light emitting window of LED(s), silicone layer 106, in one aspect, is configured to be part of the LED package. For example, silicone layer 106 of HMO can be integrated into the LED's primary optics for light extraction. An advantage of integrating silicone layer 106 with LED's primary optics is that silicone layer 106 can improve light extraction whereby additional light can be generated. It should be noted that if the index of silicone layer 106 matches with the LED's primary optics, additional light can be extracted from the LED(s).

An exemplary index range of silicone layer 106 is around 1.52 (n=1.52) which is higher than air (n=1) and is relatively closer to a Gallium Nitride ("GaN") based LED which has an index value of 2.4 (n=2.4). Note that when the index values are relatively close, the critical angle at the interface between two different materials as the light travels through is enlarged whereby it reduces total internal refraction ("TIR") loss. The typical index value for PMMA is around 1.49 (n=1.49) which is relatively closer to the index of silicone layer 106 whereby the TIR loss for a light traveling through both the silicone and PMMA medium is minimal.

An advantage of using the HMO is that it merges or combines different optical materials with different physical properties to produce better thermal resistance and affordable optics for the SLD. Another advantage of using the HMO is that it can enhance light extraction from the LED(s) because of matching or similar index values between the silicone and LED's primary optics.

FIG. 2 is a block diagram 200 illustrating an SLD containing a COB and HMO or multilayered optics having a gap in accordance with one aspect of the present invention. Diagram 200 is similar to diagram 100 shown in FIG. 1 except that diagram 200 illustrates a gap or an air gap 202 between COB 102 and silicone layer 106. Diagram 200 includes COB 102, gap 202, silicone layer 106, and PMMA layer 108, wherein gap 202, silicone layer 106, and PMMA layer 108, in one aspect, forms HMO. COB 102 includes a light emitting surface 112 and a connecting surface 110 wherein light emitting surface 112 includes one or more LED arrays which generate optical light. It should be noted that the underlying concept of the exemplary aspect(s) of the present invention would not change if one or more elements (or layers) were added to or removed from diagram 200.

The SLD, in one aspect, includes HMO or multi-layer optical structure formed over an LED array or COB 102. The HMO includes a first layer that is located closest to the LED array and has a higher melting point than the adjacent layer that is further away from the LED array. For example, the HMO contains a PMMA optic or PMMA layer 108 that contains a silicone coating or silicone layer 106 applied on a portion of the PMMA optic facing the LED array. Alternatively, a gap such as gap 202 filled with gas, air, or gel may be applied between COB 102 and silicone layer 106 to enhance thermal gradient across SLD.

Gap 202, in one aspect, is inserted or placed between silicone layer 106 and COB 102 to redistribute thermal gradient for thermal control. Depending on the applications, dimension of gap 202 such as width or length of the gap can be adjusted to achieve adequate thermal separation. Gap 202 can be filled with air or inert gas depending on the operating temperature of silicone layer 106 as well as heat generated by COB 102. For example, gap 202 can be filled with purified nitrogen gas or argon gas or a combination of nitrogen and argon gases to enhance thermal tolerance. It should be noted that combining various chemical gases can increase heat tolerance as well as index matching. Gap 202 can also be filled with index matching gel, liquid, and/or paste to adjust index as well as heat tolerance.

During the operation, a thermal gradient as pointed by numeral 206-220 across the HMO is established. For example, radiant heat 206-208 is warmer or hotter than radiant heat 210-212 because radiant heat 206-208 is just left from COB 102. Similarly, radiant heat 210-212 is warmer or hotter than radiant heat 214-216 because radiant heat 214-216 is further away from COB 102. Upon passing through the HMO, radiant heat 214-216 exits PMMA layer 108 and becomes radiant heat 218-220 which is subsequently dissipated into the surrounding environment outside of PMMA layer 108.

An advantage of employing the HMO containing a gap is that the gap can assist optimizing heat redistribution across the optics for heat dissipation. It should be noted that the temperature at the light emitting surface of COB 102 can be relatively high depending on the amount of optical flux generated. As such, inserting a gap or air gap between the light emitting surface of COB 102 and the light receiving surface of silicone layer 106 can alleviate overheating of silicone layer 106.

Figure 3A:
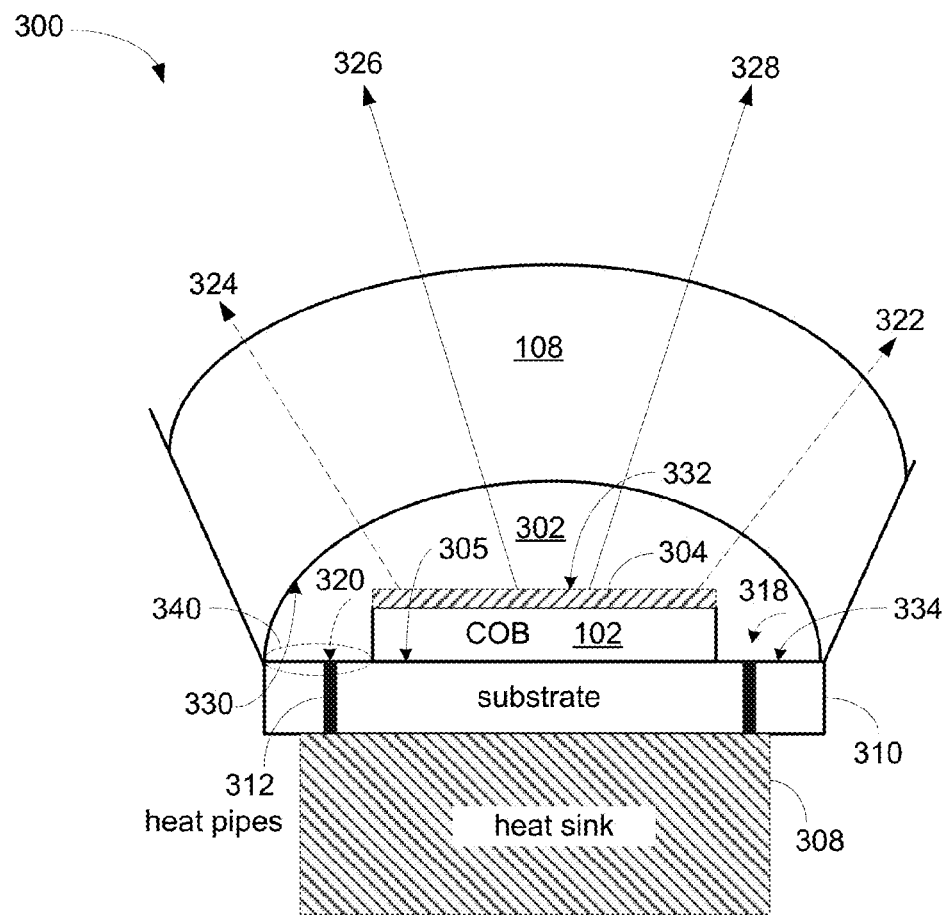
FIGS. 3A-B are block diagrams illustrating SLDs containing a COB, a multilayered optics, a substrate, and a heat sink in accordance with one aspect of the present invention.

FIG. 3A is a block diagram 300 illustrating an SLD containing a substrate and a heat sink in accordance with one aspect of the present invention. Diagram 300 is similar to diagram 100 shown in FIG. 1 except that diagram 300 further includes a substrate 310 and a heat sink 308. Diagram 300 includes COB 102, substrate 310, heat sink 308, silicone layer 302, and PMMA layer 108. In one aspect, silicone layer 302 and PMMA layer 108 are combined to form HMO. COB 102 further includes a light emitting surface 304 which contains one or more LEDs for emitting optical light. It should be noted that the underlying concept of the exemplary aspect(s) of the present invention would not change if one or more elements (or layers) were added to or removed from diagram 300.

The SLD, in one example, includes COB 102, silicone layer 302, PMMA layer 108, substrate 310, and heat sink 308 for providing visible light. COB 102 includes a light emitting surface 304 and a connecting surface 305 wherein surface 304 contains at least one LED or LED array capable of emitting light 326-328 in response to the electrical current supplied by substrate 310. Light 326-328 leaves light emitting surface 304 and becomes visible light after passing through the HMO. The SLD, in one example, can be used in street lighting, home lighting, electronic billboard illumination, automobile lighting, or the like.

Silicone layer 302, also known as SIL, includes a first silicone surface 330, a second silicone surface 332, and a third silicone surface 334, wherein first silicone surface 330 is in contact with PMMA layer 108. Second silicone surface 332 of silicone layer 302 is used to interface and/or meet with light emitting surface 304 of COB 102 and is capable of transmitting light as well as heat. Third silicone surface 334 of silicone layer 302, in one aspect, is used to touch, communicate, or border with at least a portion of substrate 310 as indicated by numeral 340. Second silicone surface 332, in one aspect, is disposed over or in contact with light emitting surface 304 of COB 102. A function of second silicone surface 332 is to transmit light from COB 102 to PMMA layer 108 as well as dissipate heat generated by LED(s) at light emitting surface 304. In addition to light passage, first silicone surface 330 is also capable of transferring heat from second silicone surface 332 to PMMA layer 306. Third silicone surface 334, in one aspect, is used to dissipate heat or transfer heat from silicone layer 302 to heat sink 308 via substrate 310.

Substrate 310, in one aspect, includes multiple heat pipes or heat channels 312 configured to pass or transfer heat from one substrate surface to another substrate surface. In addition to provide structural support to LSD, substrate 310 is also used to provide electrical connections such as power supplies. The first substrate surface of substrate 310 houses COB 102 and the second substrate surface of substrate 310 is coupled with heat sink 308. An advantage of using substrate 310 is that it channels or transfers heat from silicone layer 302 to heat sink 308 via one or more heat pipes 312.

Heat sink 308 is mounted at the second substrate surface of substrate 310 for heat dissipation. Heat sink 308, for example, can be made of heat or thermal conductive materials such as aluminum, copper, steel, polymer, alloy, or the like. The dimension of heat sink 308 can vary depending on the applications. In some applications, multiple heat sinks may be used to improve heat dissipation.

During the operation of generating light, the LED or LED array generates light 326-328 as well as heat such as radiant heat 318-324. A portion of the heat such as radiant heat 322 is dissipated to the surrounding environment of SLD via the HMO. Another portion of the heat such as radiant heat 318 or 320 is dissipated through heat sink 308 via substrate 310. In one aspect, heat pipes 312 are used to assist transferring heat such as radiant heat 318 or 320 from silicone layer 302 to heat sink 308 via heat pipes 312 which tunnels through substrate 310. Note that heat pipes 312 can be embedded in substrate 310 using thermal conductive materials.

An advantage of using the substrate and heat sink is that the substrate is able to dissipate heat generated by LEDs using thermal conductive heat pipes or channels.

Figure 3B:
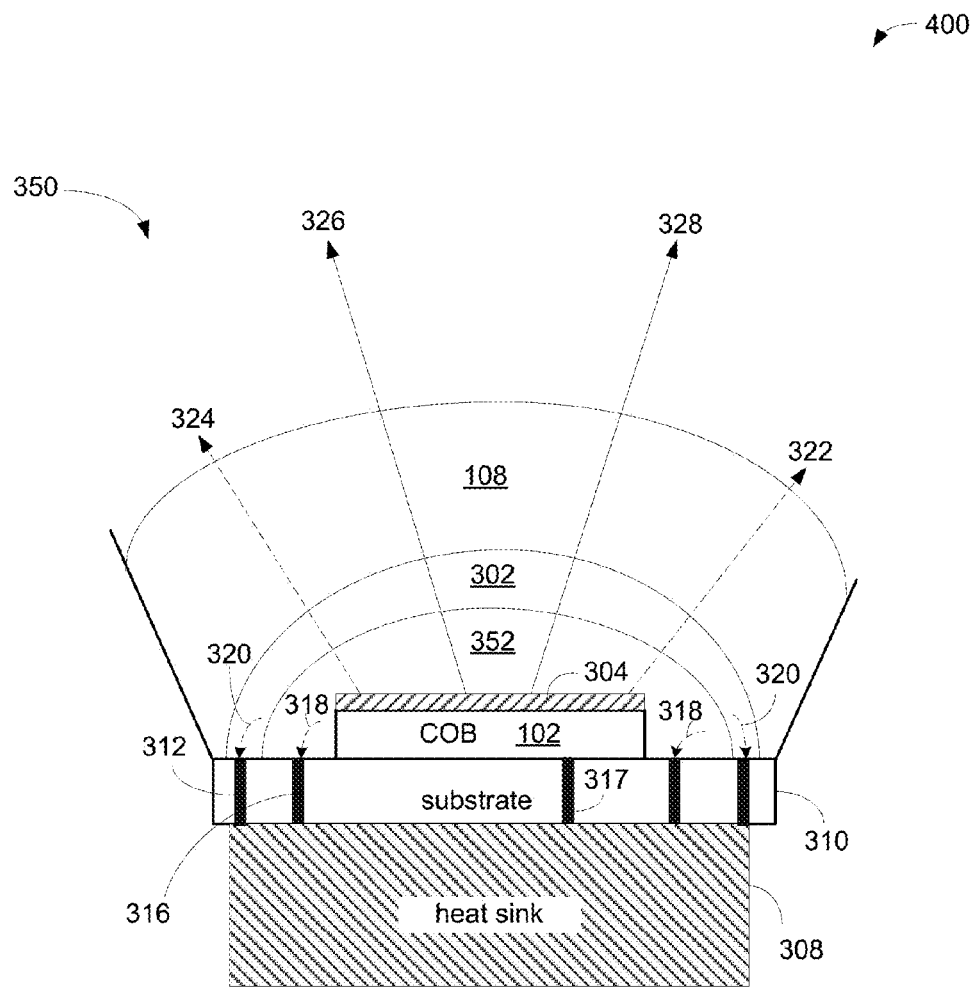

FIG. 3B is a block diagram 350 illustrating an SLD containing an HMO with a gap in response to temperature change in accordance with one aspect of the present invention. Diagram 350 is similar to diagram 300 shown in FIG. 3A except that diagram 350 illustrates a gap 352. Diagram 350 includes COB 102, gap 352, substrate 310, heat sink 308, silicone layer 302, and PMMA layer 108, wherein silicone layer 302, gap 352, and PMMA layer 108, in one aspect, are laminated to form the HMO. COB 102 includes multiple LEDs organized in an LED array for emitting optical light.

The SLD includes COB 102, gap 352, silicone layer 302, PMMA layer 108, substrate 310, and heat sink 308 for providing light. COB 102, in one aspect, provides visible light such as light 326 or 328 in response to electrical current supplied by substrate 310. Gap 352, in one aspect, is created or inserted between light emitting surface 304 of COB 102 and the light receiving surface of silicone layer 302. A function of gap 352 is to keep the heat or high temperature generated by COB 102 away from silicone layer 302. PMMA layer 108 is disposed over silicone layer 302 and gap 352 to form the HMO. Note that gap 352 may be filled with inert gas to change reflective index value and/or thermal conductivity. In one aspect, a portion of gap 352 is in contact with substrate 310 whereby substrate 310 is able to facilitate heat flow (or dissipation) from gap 352 to heat sink 308 via substrate 310 and/or heat pipes 316.

During an operation, the LED generates light and heat wherein the heat such as radiant heat 318 or 324 dissipates or flows from various directions as shown in FIG. 3B. A portion of the heat such as radiant heat 322 is dissipated into the surrounding environment of SLD via the HMO. Another portion of the heat such as radiant heat 320 is dissipated to heat sink 308 traveling from silicone layer 302 to heat sink 308 via heat piper 312. Another portion of heat such as radiant heat 318 is dissipated from gap 352 to heat sink 308 via heat pipes 316. In an alternative aspect, additional heat pipes such as heat pipe 317 may be added to provide additional heat dissipation. For example heat pipe 317 may be used to dissipate heat from COB 102 to heat sink 308 to reduce overall heat accumulation around COB 102.

Figure 4:
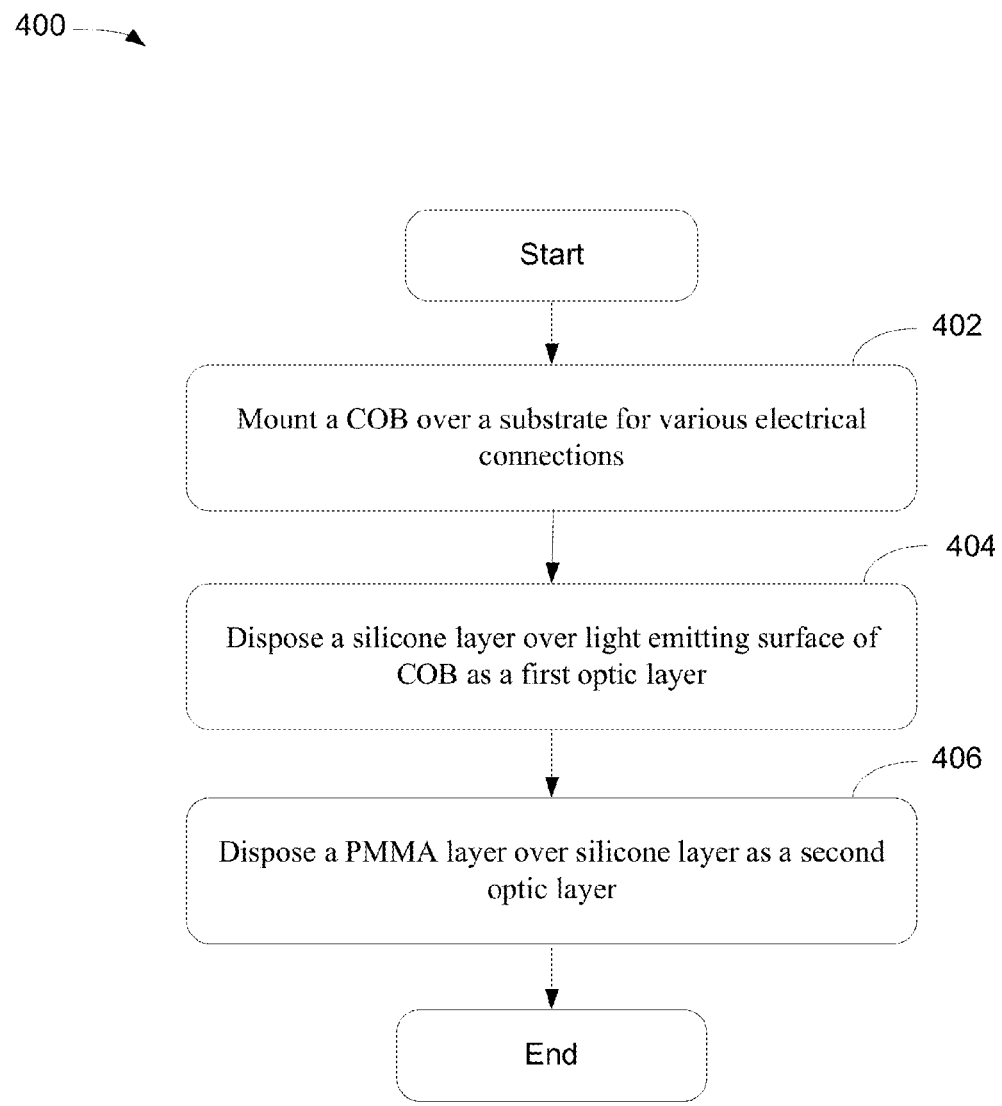
FIG. 4 is a flowchart illustrating a process of fabricating an SLD using a multilayered optics in accordance with one aspect of the present invention.

FIG. 4 is a flowchart 400 illustrating a process of fabricating an SLD using a multilayered optics or HMO in accordance with one aspect of the present invention. At block 402, the process is able to mount or place a COB on a substrate for physical support and electrical connections. In one example, multiple LEDs or LED arrays have been deposited on the COB during chip and/or device fabrication process. It should be noted that LED array may include one LED or a group of LEDs.

At block 404, a silicone layer or SIL with a range of operating temperature (or melting point) from 100° C. to 300° C. is disposed over a light emitting surface of the COB as a first layer of a multilayered optics or HMO. The HMO is capable of dissipating heat from the light emitting surface of the COB to outer surface of the SLD via the silicone layer. In one example, generating an air gap is created or generated between the inner surface of the silicone layer and the light emitting surface of the COB for providing thermal separation between the COB and the silicone layer.

At block 406, a PMMA layer having a range of operating (or melting) temperature from 85° C. to 130° C. is disposed over the silicone layer as a second layer of the multilayered optics or HMO. In one aspect, the COB is also attached to a substrate which is further coupled to a heat sink for heat dissipation. The substrate and heat sink are able to dissipate heat generated by the COB.

Having briefly described aspects of SLD having an HMO capable of dissipating heat generated by an LED or an array of LEDs in which the aspect of present invention operates, the following figures illustrate exemplary process and/or method to fabricate and package LED dies, chips, device, and/or fixtures.

Figure 5:
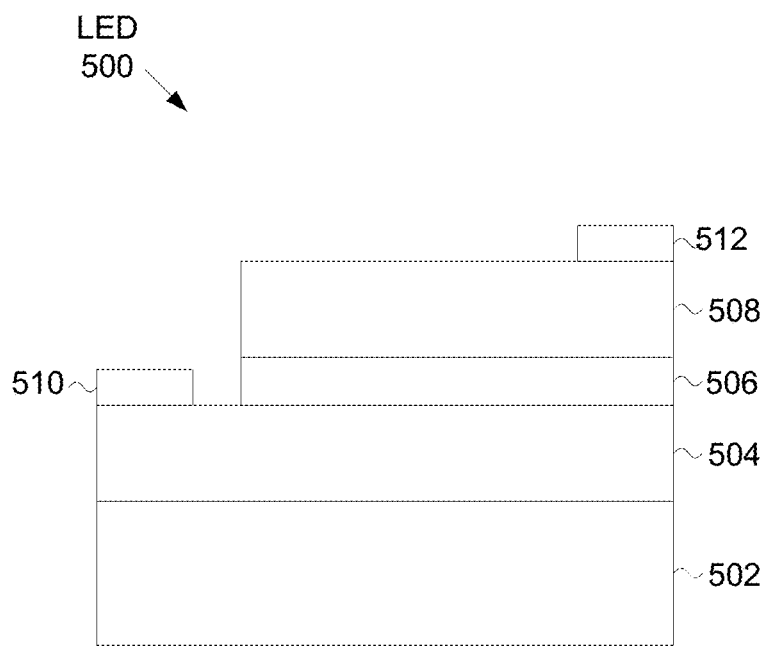
FIG. 5 is a conceptual cross-sectional view illustrating an exemplary fabrication process of an LED or LED devices in accordance with one aspect of the present invention.

FIG. 5 is a conceptual cross-sectional view illustrating an exemplary fabrication process of an LED, LED die, or LED device in accordance with an aspect of present invention. An LED is a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions. Referring to FIG. 5, LED 500 includes an n-type semiconductor region 504 and a p-type semiconductor region 508. A reverse electric field is created at the junction between the two regions, which cause the electrons and holes to move away from the junction to form an active region 506. When a forward voltage sufficient to overcome the reverse electric field is applied across the p-n junction through a pair of electrodes 510, 512, electrons and holes are forced into the active region 506 and recombine. When electrons recombine with holes, they fall to lower energy levels and release energy in the form of light.

In this example, the n-type semiconductor region 504 is formed on a substrate 502 and the p-type semiconductor region 508 is formed on the active layer 506, however, the regions may be reversed. That is, the p-type semiconductor region 508 may be formed on the substrate 502 and the n-type semiconductor region 504 may formed on the active layer 506. As those skilled in the art will readily appreciate, the various concepts described throughout this disclosure may be extended to any suitable layered structure. Additional layers or regions (not shown) may also be included in the LED 500, including but not limited to buffer, nucleation, contact and current spreading layers or regions, as well as light extraction layers.

The p-type semiconductor region 508 is exposed at the top surface, and therefore, the p-type electrode 512 may be readily formed thereon. However, the n-type semiconductor region 504 is buried beneath the p-type semiconductor layer 508 and the active layer 506. Accordingly, to form the n-type electrode 510 on the n-type semiconductor region 504, a cutout area or "mesa" is formed by removing a portion of the active layer 506 and the p-type semiconductor region 508 by means well known in the art to expose the n-type semiconductor layer 504 there beneath. After this portion is removed, the n-type electrode 510 may be formed.

Figure 6:
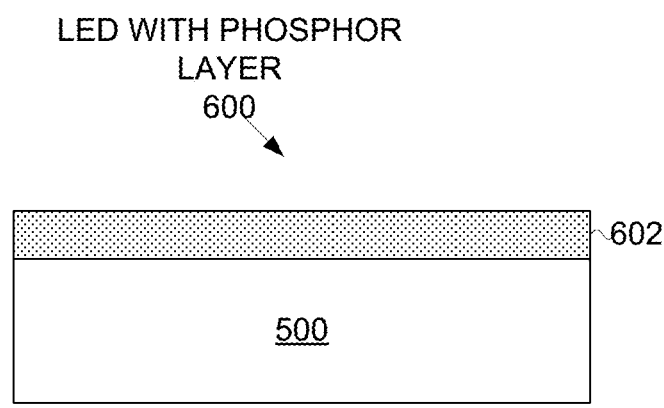
FIG. 6 is a conceptual cross-sectional view illustrating an example of an LED with a phosphor layer in accordance with one aspect of the present invention.

FIG. 6 is a conceptual cross-sectional view illustrating an example of an LED with a phosphor layer. In this example, a phosphor layer 602 is formed on the top surface of the LED 500 by means well known in the art. The phosphor layer 602 converts a portion of the light emitted by the LED 500 to light having a different spectrum. A white LED light source can be constructed by using an LED that emits light in the blue region of the spectrum and a phosphor that converts blue light to yellow light. A white light source is well suited as a replacement lamp for conventional luminaries; however, the invention may be practiced with other LED and phosphor combinations to produce different color lights. The phosphor layer 602 may include, by way of example, phosphor particles suspended in a carrier or be constructed from a soluble phosphor that is dissolved in the carrier.

Figure 7A:
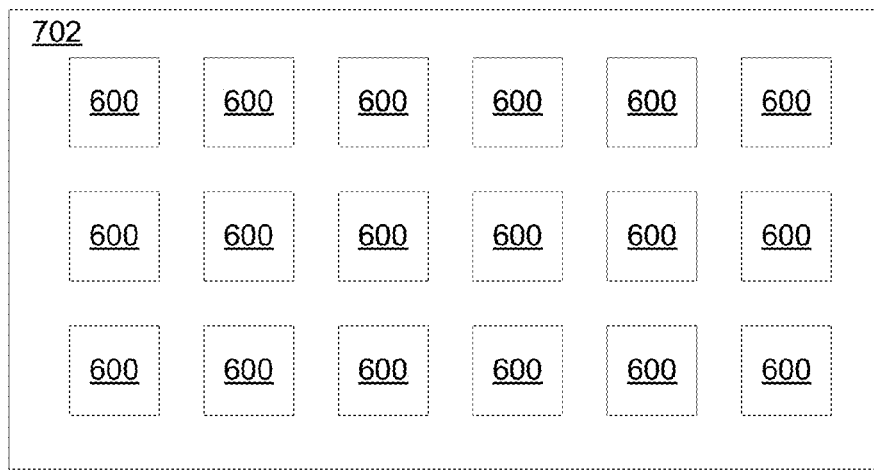
FIG. 7A is a conceptual top view illustrating an example of an LED array using a multi-layer or multilayered optics in accordance with one aspect of the present invention.
Figure 7B:
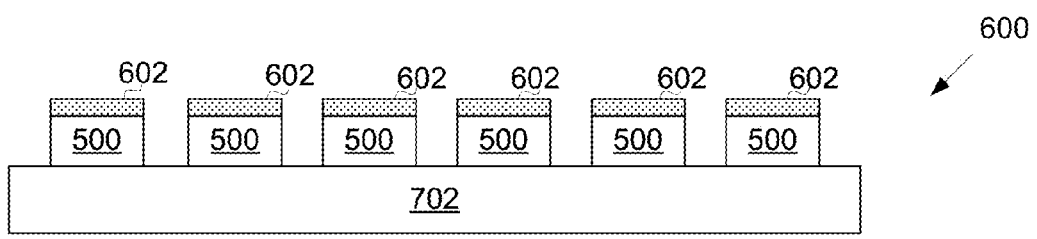
FIG. 7B is a conceptual cross-sectional view of the LED array of FIG. 7A in accordance with one aspect of the present invention.

In a configuration of LED luminaries, an LED array may be used to provide increased luminance. FIG. 7A is a conceptual top view illustrating an example of an LED array, and FIG. 7B is a conceptual cross-sectional view of the LED array of FIG. 7A. In this example, a number of phosphor-coated LEDs 600 may be formed on a substrate 702. The bond wires (not shown) extending from the LEDs 600 may be connected to traces (not shown) on the surface of the substrate 702, which connect the LEDs 600 in a parallel and/or series fashion. In some aspects, the LEDs 600 may be connected in parallel streams of series LEDs with a current limiting resistor (not shown) in each stream. The substrate 702 may be any suitable material that can provide support to the LEDs 600 and can be mounted within a light fixture (not shown).

Figure 8A:
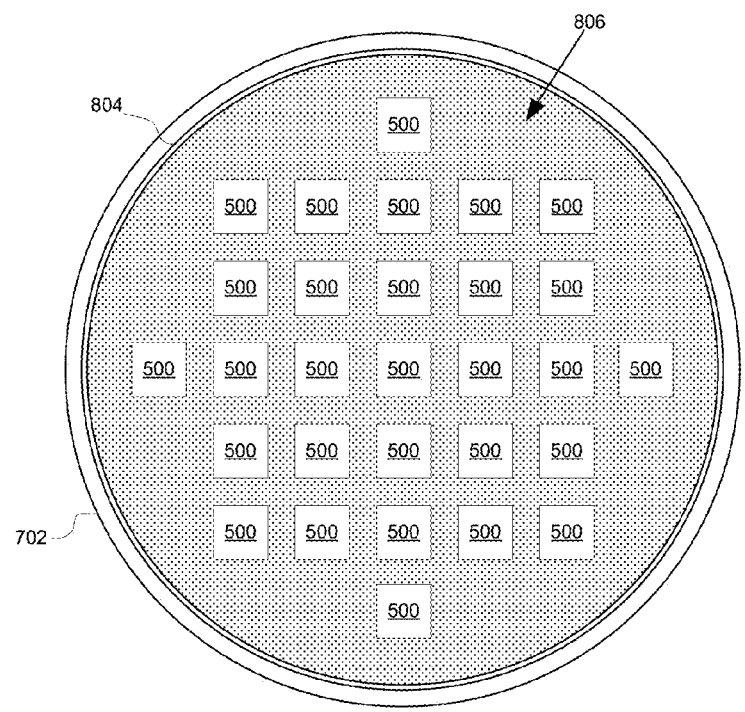
FIG. 8A is a conceptual top view illustrating an example of an alternative configuration of an LED array that employs multilayered optics in accordance with one aspect of the present invention.
Figure 8B:
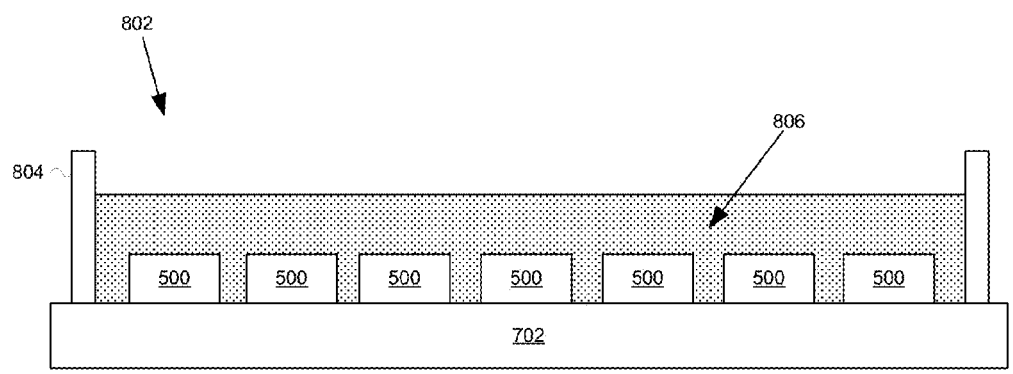
FIG. 8B is a conceptual cross-sectional view of the LED array of FIG. 8A in accordance with one aspect of the present invention.

FIG. 8A is a conceptual top view illustrating an example of an alternative configuration of an LED array, and FIG. 8B is a conceptual cross-sectional view of the LED array of FIG. 8A. In a manner similar to that described in connection with FIGS. 7A and 7B, a substrate 702 designed for mounting in a light fixture (not shown) may be used to support an array of LEDs 500. However, in this configuration, a phosphor layer is not formed on each individual LED. Instead, phosphor 806 is deposited within a cavity 802 bounded by an annular ring 804 that extends circumferentially around the outer surface of the substrate 702. The annular ring 804 may be formed by boring a cylindrical hole in a material that forms the substrate 702. Alternatively, the substrate 702 and the annular ring 804 may be formed with a suitable mold, or the annular ring 804 may be formed separately from the substrate 702 and attached to the substrate using an adhesive or other suitable means. In the latter configuration, the annular ring 804 is generally attached to the substrate 702 before the LEDs 500, however, in some configurations, the LEDs may be attached first. Once the LEDs 500 and the annular ring 804 are attached to the substrate 702, a suspension of phosphor particles in a carrier may be introduced into the cavity 802. The carrier material may be an epoxy or silicone; however, carriers based on other materials may also be used. The carrier material may be cured to produce a solid material in which the phosphor particles are immobilized.

Figure 9:
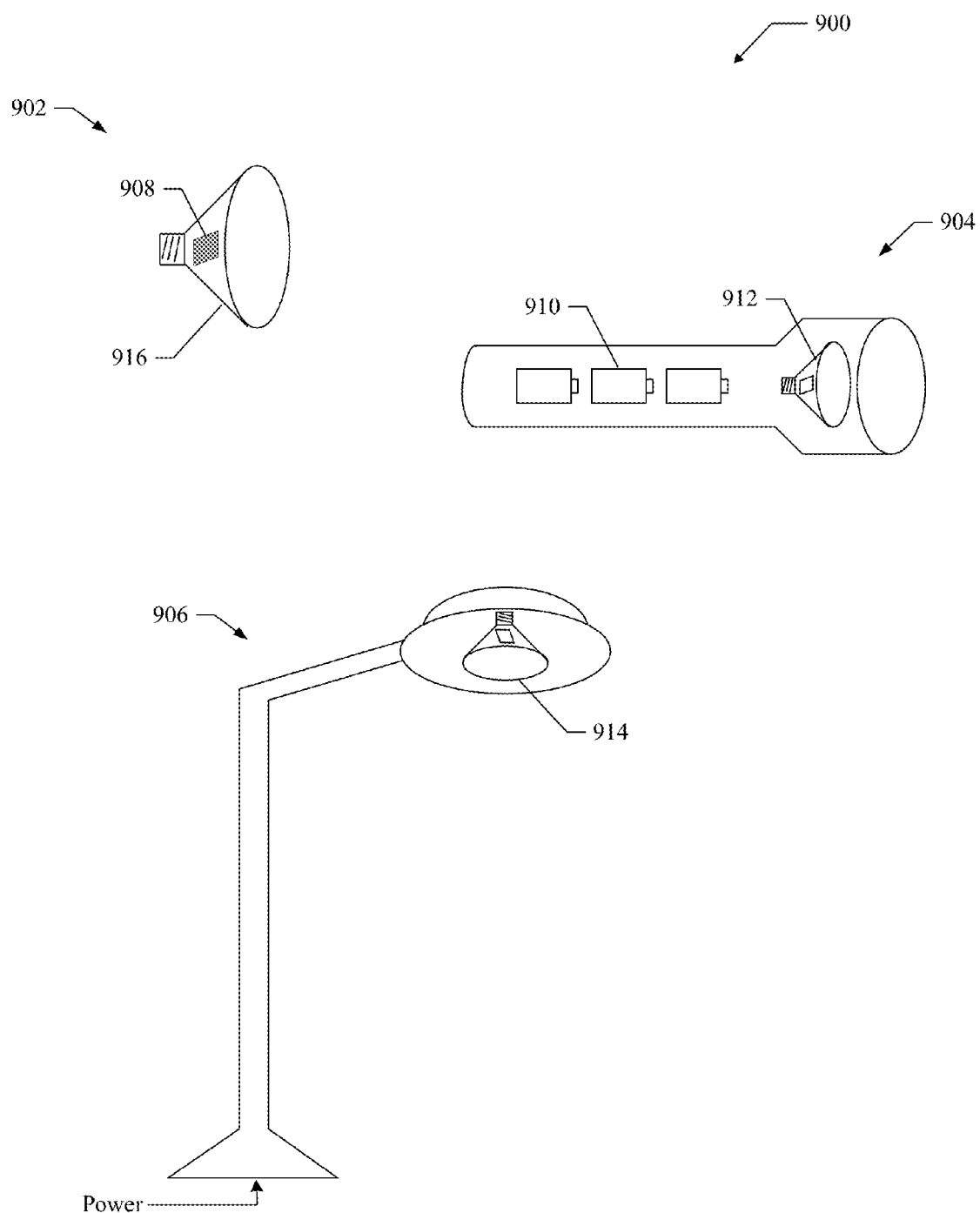
FIG. 9 shows exemplary lighting devices including LED devices using multilayered optics in accordance with one aspect of the present invention.

FIG. 9 shows exemplary devices including blue and red LEDs capable of providing a warm white light in accordance with aspects of the present invention. The devices 900 include a lamp 902, an illumination device 904, and a street light 906. Each of the devices shown in FIG. 9 includes LEDs having blue LEDs and red LEDs capable of providing passive color control scheme as described herein. For example, lamp 902 includes a package 916 and an LED 908, in which LED 908 employs one or more metal traces to provide flexible connections. Lamp 902 may be used for any type of general illumination. For example, lamp 902 may be used in an automobile headlamp, street light, overhead light, or in any other general illumination application. Illumination device 904 includes a power source 910 that is electrically coupled to a lamp 912, which may be configured as lamp 902. In one aspect, power source 910 may be batteries or any other suitable type of power source, such as a solar cell. Street light 906 includes a power source connected to a lamp 914, which may be configured as lamp 902. It should be noted that aspects of the LED described herein are suitable for use with virtually any type of LED assembly, which in turn may be used in any type of illumination device and are not limited to the devices shown in FIG. 9.

The various aspects of this disclosure are provided to enable one of ordinary skills in the art to practice the present invention. Various modifications to aspects presented throughout this disclosure will be readily apparent to those skilled in the art, and the concepts disclosed herein may be extended to other LED lamp configurations regardless of the shape or diameter of the glass enclosure and the base and the arrangement of electrical contacts on the lamp. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skills in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light-emitting device, comprising:
   a chip-on-board ("COB") having a first surface and a second surface and containing at least one light emitter diode ("LED") situated adjacent to the first surface, the COB configured to emit optical light from the LED passing through the first surface;
   a silicone inner layer ("SIL"), having a first operating temperature, a first silicone surface, and a second silicone surface, wherein the second silicone surface of the SIL is disposed on the first surface of the COB; and
   a Poly methyl methacrylate ("PMMA") layer, having a second operating temperature, an inner surface, and an outer surface, wherein the inner surface of the PMMA layer is disposed on the first silicone surface of SIL, wherein the first operating temperature has a higher operating temperature than the second operating temperature.

2. The device of claim 1, further comprising a substrate having a first substrate surface and a second substrate surface, wherein the second surface of COB is attached to the first substrate surface of the substrate.

3. The device of claim 2, further comprising a heat sink mounted at the second substrate surface of the substrate for heat dissipation.

4. The device of claim 3, wherein the substrate includes heat dissipation channels configured to transfer heat between the COB and the heat sink via the substrate.

5. The device of claim 1, wherein the COB includes a plurality of LEDs organized in an LED array.

6. The device of claim 1, wherein the SIL has a higher melting temperature than melting temperature of the PMMA layer.

7. The device of claim 6, wherein the PMMA layer disposed over the SIL forms a multilayered optic.

8. The device of claim 6, wherein the PMMA layer disposed over the SIL forms a multilayered optical lens.

9. The device of claim 1, wherein the first operating temperature has an operating range from 100 Celsius ("° C.") to 300° C.; and wherein the second operating temperature has an operating range from 85° C. to 130° C.

10. A light-emitting device, comprising:
    a chip-on-board ("COB") having a first surface and a second surface and containing at least one light emitter diode ("LED") situated adjacent to the first surface of the COB, the COB configured to emit optical light exiting from the first surface of the COB;
    a silicone inner layer ("SIL"), having a first operating temperature, a first silicone surface, and a second silicone surface, deposited over the COB;
    an air gap created between the first surface of the COB and the second silicone surface of SIL, wherein the air gap keeps high temperature generated by the COB away from the SIL; and
    a Poly methyl methacrylate ("PMMA") layer having a second operating temperature, an inner surface, and an outer surface, wherein the inner surface of the PMMA layer is disposed on the first silicone surface of SIL, wherein the first operating temperature has a higher operating temperature than the second operating temperature.

11. The device of claim 10, further comprising:
a substrate having a first substrate surface and a second substrate surface, wherein the second surface of COB is situated on the first substrate surface; and
a heat sink mounted at the second substrate surface of the substrate for heat dissipation.

12. The device of claim 11, wherein the air gap is filled with inert gas to change reflective index value.

13. The device of claim 10, wherein the COB includes a plurality of LEDs organized in an array.

14. The device of claim 10, wherein the SIL has a higher melting temperature than melting temperature of the PMMA layer.

15. The device of claim 14, wherein the PMMA layer disposed over the air gap and the SIL forms a multilayered optics.

16. A method of fabricating a lighting device, comprising:
mounting a chip-on-board ("COB") on a substrate for physical support and electrical connections;
disposing a silicone layer having a range of melting temperature from 100 Celsius ("° C.") to 300° C. over a light emitting surface of the COB as a first layer of a multilayered optics which is able to dissipate heat from the light emitting surface of the COB to outer surface of the silicone layer via the silicone layer; and
disposing a Poly methyl methacrylate ("PMMA") layer having a melting temperature range from 85° C. to 150° C. over the silicone layer as a second layer of the multilayered optics wherein allowing the silicone layer to operate at a higher operating temperature than operating temperature of the PMMA layer.

17. The method of claim 16, wherein disposing a silicone layer further includes generating an air gap between an inner surface of the silicone layer and the light emitting surface of the COB for providing thermal separation between the COB and the silicone layer.

18. The method of claim 16, further comprising attaching a heat sink to the substrate and configured to dissipate heat from the COB to the heat sink via the substrate.

19. A light emitting diode ("LED") lamp, comprising:
a package; and
an LED apparatus coupled to the package and including:
a chip-on-board ("COB") having a first surface and a second surface and containing at least one LED situated adjacent to the first surface, the COB configured to emit optical light from the LED passing through the first surface;
a silicone inner layer ("SIL"), having a first operating temperature, a first silicone surface, and a second silicone surface, wherein the second silicone surface of the SIL is disposed on the first surface of the COB; and
a Poly methyl methacrylate ("PMMA") layer, having a second operating temperature, an inner surface, and an outer surface, wherein the inner surface of the PMMA layer is disposed on the first silicone surface of SIL, wherein the first operating temperature has a higher operating temperature than the second operating temperature.

20. The lamp of claim 19, wherein the LED apparatus further includes,
a substrate having a first substrate surface and a second substrate surface, wherein the second surface of COB is attached to the first substrate surface of the substrate; and
a heat sink mounted at the second substrate surface of the substrate for dissipating heat.

* * * * *